US006372563B1

(12) United States Patent
Krivokapic et al.

(10) Patent No.: US 6,372,563 B1
(45) Date of Patent: Apr. 16, 2002

(54) SELF-ALIGNED SOI DEVICE WITH BODY CONTACT AND NISI2 GATE

(75) Inventors: Zoran Krivokapic, Santa Clara; Shekhar Pramanick, Freemon, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 4 days.

(21) Appl. No.: 09/614,894

(22) Filed: Jul. 12, 2000

Related U.S. Application Data

(62) Division of application No. 09/093,580, filed on Jun. 8, 1998, now Pat. No. 6,091,123.

(51) Int. Cl.[7] .......................... H01L 21/00; H01L 21/84

(52) U.S. Cl. .......................................................... 438/166

(58) Field of Search ................................ 438/149, 151, 438/152, 164, 166, 405, 443, 486

(56) References Cited

U.S. PATENT DOCUMENTS

| | | | | |
|---|---|---|---|---|
| 4,716,128 A | | 12/1987 | Schubert et al. | |
| 4,763,183 A | | 8/1988 | Ng et al. | |
| 5,494,837 A | | 2/1996 | Subramanian et al. | |
| 5,595,923 A | | 1/1997 | Zhang et al. | |
| 5,851,890 A | | 12/1998 | Tsai et al. | |
| 5,854,509 A | | 12/1998 | Kunikiyo | |
| 5,937,315 A | * | 8/1999 | Xiang et al. | 438/486 |
| 6,090,691 A | * | 7/2000 | Ang et al. | 438/564 |
| 6,198,134 B1 | * | 3/2001 | Inoue et al. | 257/351 |
| 6,204,532 B1 | * | 3/2001 | Gambino et al. | 257/329 |
| 6,225,197 B1 | * | 5/2001 | Maekawa | 438/487 |

OTHER PUBLICATIONS

Erokhin et al, Article entitled, “Spatially Confined Nickle Disilcide Formation at 400°C On Ion Implantation Preamorphized Silicon”, 1993.

Wolf, Stanley “Silicon Processing For The VLSI Era, vol. 2” (Lattice Press), 1990, pp. 194 and 195.

Ghandi, Sorab K. “VLSI Fabrication Principles” (John Wiley & Sons), 1983, p. 437.

* cited by examiner

*Primary Examiner*—Long Pham
*Assistant Examiner*—William David Coleman
(74) *Attorney, Agent, or Firm*—Eschweiler & Associates LLC

(57) ABSTRACT

A self-aligned SOI device with body contact and silicide gate. The SOI device is formed using an ordinary substrate such as silicon. A silicide gate is self-aligned and formed from re-crystallization of nickel and amorphous silicon. The self-aligned silicide gate includes gate contact areas, and is self-aligned with respect to the gate opening, the source and drain regions and a nitride isolation layer. Nickel spacers deposited adjacent the isolation layer, and amorphous silicon deposited between the nickel spacers, form the self-aligned silicide gate through a silicidation process.

9 Claims, 2 Drawing Sheets

56 56 42 56 56
24 62 24
64 64
30 30
52 50 54

SELF-ALIGNED SOI DEVICE WITH BODY CONTACT AND NISI2 GATE

This application is a division of application Ser. No. 09/093,580, filed Jun. 8, 1998, now U.S. Pat. No. 6,091,123.

BACKGROUND OF THE INVENTION

The present invention relates to the manufacture of semiconductor integrated circuits, and more particularly, to a self-aligned SOI device having a silicide gate and body contact.

As the push to include greater and greater device densities on a single integrated circuit continues, manufactures are looking for better or new opportunities to shrink device geometries. As device geometries decrease into deep submicron dimensions, the need for greater control and precision over the formation of thin, uniform, planar and low resistivity silicide contact layers increases. Attempts have been made to form silicide contact layers from a combination of a metal film with an amorphous as opposed to a crystalline substrate.

The silicidation process is the process of forming silicon-metal substances at the boundary between a layer of silicon and a metal layer. Amorphous silicon has also been known to react better than crystalline silicon with certain metals such as for example nickel. In deep submicron applications, therefore, the need to form self-aligned silicide gate structures becomes greater. What is lacking in the art is a structure and method for forming a self-aligned silicide gate SOI device, where the device also includes a body contact.

BRIEF SUMMARY OF THE INVENTION

In view of the above, a self-aligned SOI device and method for manufacturing same are provided. According to one aspect of the invention, a self-aligned SOI device with body contact and silicide gate is formed from ordinary substrate. An oxide layer, deposited over the ordinary substrate, is etched to provide a gate opening. An epitaxial layer is deposited over the gate opening, and a high K dielectric layer is deposited over the epitaxial layer. A self-aligned silicide gate contact, having at least one gate contact area, is disposed over the dielectric layer.

In another aspect of the invention, a method of making a self-aligned SOI device with body contact and silicide gate is provided. According to the steps of the method, an oxide layer is deposited over an ordinary substrate. The oxide layer is then etched to provide a gate opening. An epitaxial layer is deposited over the gate opening, and a high K dielectric layer is deposited over the epitaxial layer. A self-aligned silicide gate contact is formed over the dielectric layer where the gate contact includes at least one gate contact area.

The self-aligned SOI device with body contact and silicide gate can be easily manufactured according to the invention using an ordinary substrate such as silicon. These SOI devices are fully self-aligned transistors aligned throughout the isolation, source/drain and gate regions. Such devices, therefore, help provide for improved semiconductor densities.

These and other features and advantages of the invention will become apparent to those skilled in the art upon a review of the following detailed description of the presently preferred embodiments of the invention, taken in conjunction with the appended drawings.

DETAILED DESCRIPTION OF THE INVENTION

Figure 1:
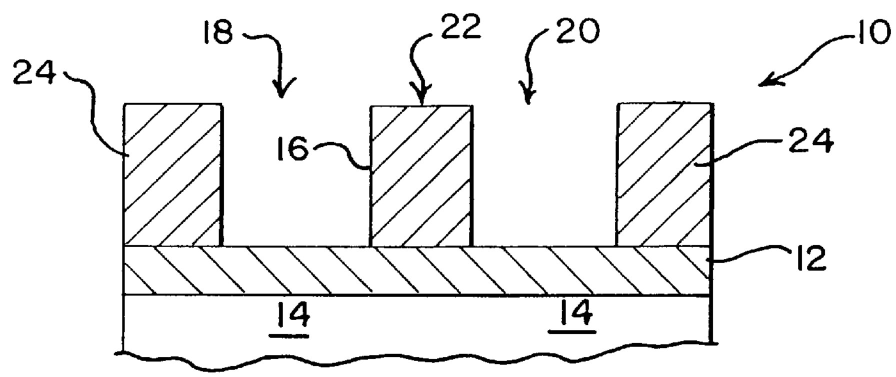
FIG. 1 is a cross-sectional view of a nitride layer deposited over a silicon substrate.

Referring now to the drawings, where like reference numerals refer to like elements throughout, one presently preferred SOI device 10 is shown generally in FIG. 1. In forming the SOI device 10, a first layer of silicon dioxide ($SiO_2$) 12 is deposited over a silicon (Si) substrate 14. Preferably, the silicon dioxide layer 12 is formed to a thickness of 100–150 nanometers. After the deposit of the silicon dioxide layer 12, a layer 16 of $Si_3N_4$ is deposited, preferably to a thickness of 250–400 nanometers. A source and drain mask.(not shown) is then used to define a source area 18 and a drain area 20 in the $Si_3N_4$ layer 16. The $Si_3N_4$ layer 16 is then etched in a conventional manner to create the source and drain areas 18, 20. As a result of the process, a gate area 22 and isolation areas 24 are also defined.

Figure 2:
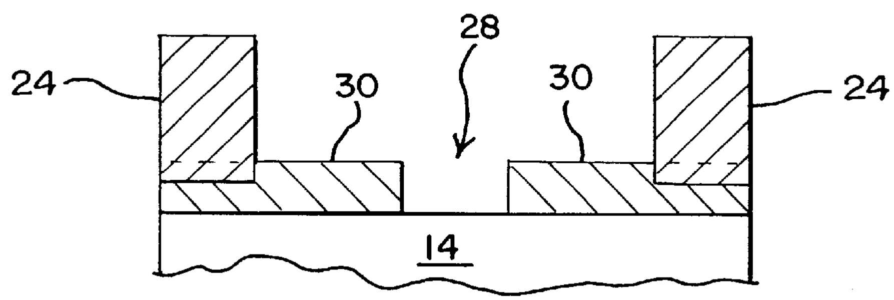
FIG. 2 is a cross-sectional view of the etching of an oxide layer deposited over the structure shown in FIG. 1 to create a gate opening.
Figure 3:
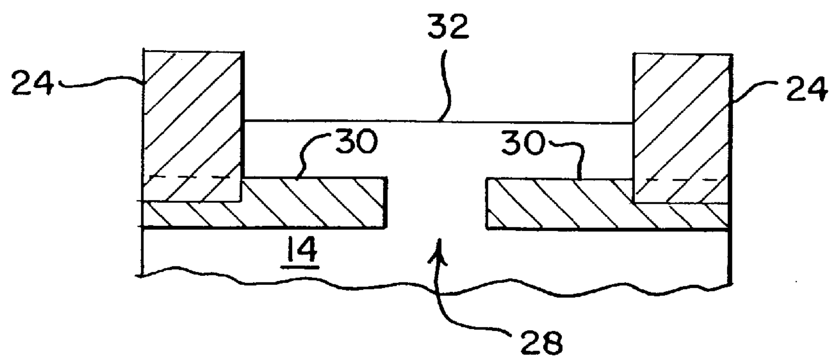
FIG. 3 is a cross-sectional view of a selective epitaxial layer deposited over the structure shown in FIG. 2.

Referring now to FIG. 2, an oxide layer 30 is deposited, preferably to a thickness of 1–1.5 micrometers. The oxide layer 30 is polished back and a gate opening mask (not shown) is applied over the structure 10. The $Si_3N_4$ layer 16 is then removed and the oxide layer 30 is etched to create the gate opening 28 shown in FIG. 2. As shown in FIG. 3, a selective epitaxial layer 32 is grown between the isolation areas 24. Preferably, the epitaxial layer 32 is grown to a thickness of 200–300 nanometers.

Figure 4:
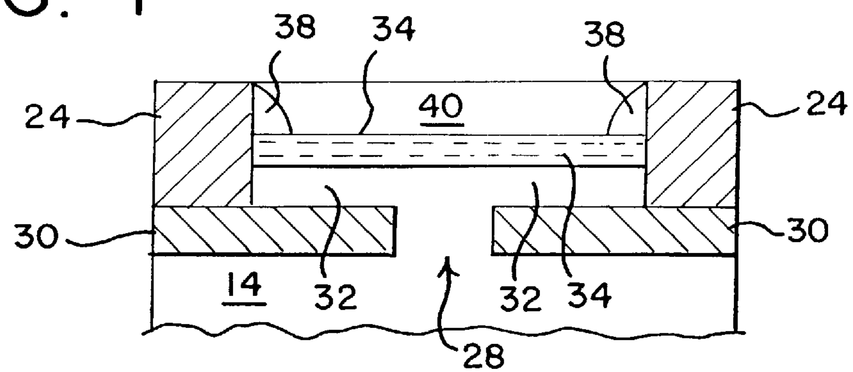
FIG. 4 is a cross-sectional view of the deposition of nickel and amorphous silicon over the structure shown in FIG. 3.

Referring next to FIG. 4, a high K dielectric material 34 is then deposited over the structure as shown. A nickel (Ni) layer (not shown) is deposited over the structure, preferably to a thickness of 100–200 nanometers. An anisotropic nickel etch is then performed to form the nickel spacers 38 shown in FIG. 4. Amorphous silicon (Si) 40 is then deposited over the structure. After the deposition, the amorphous silicon 40 is polished back to the level of the nitride isolation areas 24.

Figure 5A:
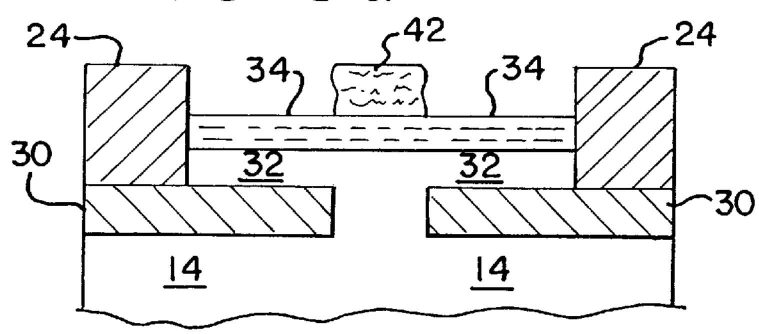
FIG. 5 is an illustration of a self-aligned silicide gate, where FIG. 5(*a*) is a cross-sectional view after polysilicon etching, and FIG. 5(*b*) is a top plan view illustrating the silicide gate and gate contract areas.
Figure 5B:
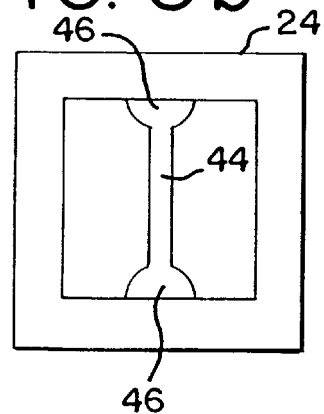

As shown in FIG. 5, nickel enhanced re-crystallization forms a layer 42 of $NiSi_2$ in the middle of the amorphous silicon layer 40. The re-crystallization process thus aligns the $NiSi_2$ layer 42 to the opening defined for the $NiSi_2$ gate 44, as shown in FIG. 5(*b*). Polysilicon etching is performed to leave the $NiSi_2$ layer 42, as shown in FIG. 5(*a*). As shown in FIG. 5(*b*), gate contact areas 46 are also defined at the distal ends of the $NiSi_2$ gate 44. The isolation nitride layer 24 is also shown in FIG. 5(*b*).

Figure 6:
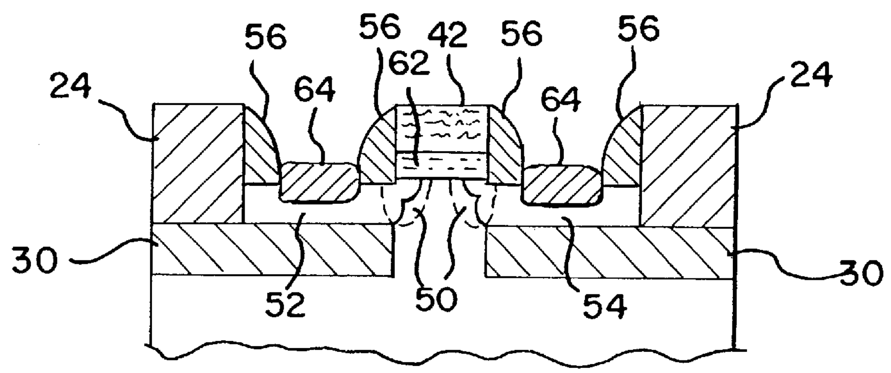
FIG. 6 is a cross-sectional view of the structure shown in FIG. 5 illustrating the source and drain implants and silicide formation in the source and drain regions.

Referring to FIG. 6, a channel implant 50 is then provided as well as source and drain extension implants 52, 54. Oxide spacers 56 are then formed, and the source 18 and drain 20 are implanted. The high K dielectric layer 62 is then etched to reveal the structure shown in FIG. 6. Silicidation is then allowed to occur thus forming the silicide areas 64 shown in FIG. 6. In the presently preferred embodiment of the invention, the silicidation process is induced by thermal annealing. The thermal annealing is preferably conducted at a temperature of 350–525° C. As a result, a layer of nickel disilicide is created to a preferred thickness of 30–60 nanometers.

As can be seen, the present invention allows for the manufacture of SOI devices on ordinary substrates without creating a floating body effect. The invention thus provides for improved semi-conductor densities. The SOI devices described above further provide fully self-aligned transistors each transistor also having body contacts. The transistors are also fully self-aligned throughout the isolation, source/drain and gate regions.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

We claim:

1. A method of making a self-aligned SOI device with body contact and silicide gate, comprising the steps of:

depositing an oxide layer over an ordinary substrate;

etching the oxide layer to provide a gate opening;

depositing an epitaxial layer over the gate opening;

depositing a high K dielectric over the epitaxial layer, and forming a self-aligned silicide gate contact over the dielectric layer, the gate contact including at least one gate contact area, wherein forming the self-aligned suicide gate contact comprises:

forming a nickel layer over the high K dielectric;

forming an amorphous silicon layer over the nickel layer; and re-crystallizing the nickel layer and the amorphous silicon layer, thereby providing a silicide associated therewith.

2. The method defined in claim 1 further comprising the step of implanting source and drain extension implants.

3. The method defined in claim 2, further comprising the step of forming oxide spacers in the source and drain regions.

4. The method defined in claim 3, further comprising the step of forming a silicide layer over the source and drain regions.

5. The method defined in claim 4, further comprising the step of depositing at least one channel dopant between the source and drain regions.

6. The method defined in claim 1, further comprising the step of depositing nitride spacers over the oxide layer.

7. A method of making a self-aligned SOI device with a body contact and a suicide gate, comprising the steps of:

depositing an oxide layer over an ordinary substrate;

etching the oxide layer to provide a gate opening;

depositing an epitaxial layer to provide a gate opening;

depositing a high K dielectric over the epitaxial layer; and forming a self-aligned silicide gate contact over the dielectric layer, the gate contact including at least one gate contact area, wherein forming the self-aligned gate contact further comprises:

depositing a nickel layer over the dielectric layer;

selectively patterning the nickel layer, thereby defining one or more nickel spacer regions over the dielectric layer;

depositing an amorphous silicon layer over the nickel spacer regions and the dielectric layer;

planarizing the amorphous silicon layer and the dielectric layer;

performing nickel enhanced re-crystallization with the nickel spacer regions and the amorphous silicon layer, thereby forming a nickel silicide layer; and patterning the nickel suicide layer, thereby defining the self-aligned silicide gate contact.

8. The method of claim 7, wherein one or more portions of the nickel layer are non-planar, and wherein selectively patterning the nickel layer comprises performing a blanket anisotropic etch of the nickel layer, wherein one or more portions of the nickel layer associated with the one or more non-planar portions define the one or more nickel spacer regions.

9. The method of claim 7, wherein planarizing the amorphous silicon layer comprises polishing the amorphous silicon layer.

* * * * *

UNITED STATES PATENT AND TRADEMARK OFFICE
CERTIFICATE OF CORRECTION

PATENT NO. : 6,372,563 B1
DATED : April 16, 2002
INVENTOR(S) : Zoran Krivokapic and Shekhar Pramanick It is certified that error appears in the above-identified patent and that said Letters Patent is hereby corrected as shown below:

Column 4,
Line 31, please replace the word "suicide" with the word -- silicide --.

Signed and Sealed this

Eighteenth Day of June, 2002

Attest:

JAMES E. ROGAN

*Attesting Officer*

*Director of the United States Patent and Trademark Office*